US006353354B1

(12) United States Patent
Detweiler et al.

(10) Patent No.: US 6,353,354 B1
(45) Date of Patent: Mar. 5, 2002

(54) PULSE-WIDTH MODULATED BRIDGE CIRCUIT WITHIN A SECOND BRIDGE CIRCUIT

(75) Inventors: James P. Detweiler, Lansdale; Jerry K. Goff, deceased, late of Doyleston, both of PA (US), by Kenneth W. Goff, executor (73) Assignee: MTS Systems Corporation, Eden Prairie, MN (US)

( * ) Notice: Subject to any disclaimer, the term of this patent is extended or adjusted under 35 U.S.C. 154(b) by 0 days.

(21) Appl. No.: 09/669,659

(22) Filed: Sep. 26, 2000

Related U.S. Application Data
(60) Provisional application No. 60/199,560, filed on Apr. 25, 2000, and provisional application No. 60/156,386, filed on Sep. 28, 1999.

(51) Int. Cl.[7] .............................................. H03K 17/56
(52) U.S. Cl. ........................................ 327/423; 327/110
(58) Field of Search ................................ 327/108, 109, 327/110, 111, 112, 423, 424, 588

(56) References Cited

U.S. PATENT DOCUMENTS

| | | | |
|---|---|---|---|
| 3,260,912 A | 7/1966 | Gregory | 318/341 |
| 3,351,873 A | 11/1967 | Kimura | 332/9 |
| 3,393,363 A | 7/1968 | Forster, Jr. | 325/38 |
| 3,535,657 A | 10/1970 | Webb | 332/9 |
| 3,849,709 A | 11/1974 | Berman et al. | 318/227 |
| 3,883,786 A | 5/1975 | McNaughton et al. | 318/317 |
| 4,338,658 A | 7/1982 | Toy | 363/72 |
| 4,388,579 A | 6/1983 | Ellis | 318/732 |
| 4,562,549 A | 12/1985 | Tanaka et al. | 364/486 |
| 4,581,693 A | 4/1986 | Ueda et al. | 363/41 |
| 4,584,505 A | 4/1986 | Chung et al. | 318/254 |
| 4,615,000 A | 9/1986 | Fujii et al. | 363/41 |
| 4,617,675 A | 10/1986 | Ashikaga et al. | 375/22 |
| 4,626,803 A | 12/1986 | Holm | 332/9 R |
| 4,686,436 A | 8/1987 | Archer | 318/254 |
| 4,689,802 A | 8/1987 | McCambridge | 375/22 |
| 4,698,744 A | 10/1987 | Itani et al. | 364/140 |
| 4,706,180 A | 11/1987 | Wills | 363/132 |
| 4,742,316 A | 5/1988 | Riedger | 332/9 R |
| 4,763,059 A | 8/1988 | Espelage et al. | 318/811 |
| 4,904,919 A | 2/1990 | McNaughton | 318/798 |
| 5,070,292 A | 12/1991 | Goff | 318/811 |
| 5,081,409 A | 1/1992 | Goff | 318/811 |
| 5,105,153 A | 4/1992 | Mueller et al. | 324/322 |
| 5,239,454 A | 8/1993 | Dhyanchand | 363/43 |
| 5,270,657 A | 12/1993 | Wirth et al. | 324/322 |
| 6,121,800 A * | 9/2000 | Leighton et al. | 327/110 |

OTHER PUBLICATIONS

Reprint: Motion, "Basic PWM Servo-Amplifier Theory", Jul./Aug. 1987.

* cited by examiner

Primary Examiner—Jeffrey Zweizig
(74) Attorney, Agent, or Firm—Westman, Champlin & Kelly, P.A.; S. Koehler (57) ABSTRACT

A circuit for providing a current through a load includes a first bridge circuit connectable to the load. The first bridge circuit selectively applies a voltage across the load. A second bridge circuit is connected to the first bridge circuit and is connectable to a power supply. The second bridge circuit selectively applies voltage to terminals of the first bridge circuit.

15 Claims, 11 Drawing Sheets

FIG. 1A  VLD = +VBUS

FIG. 1B  VLD = (-)VBUS

FIG. 2A  VLD = 2VBUS

FIG. 2B  VLD = 0

FIG. 3A  VLD = +VBUS

FIG. 3B  VLD = (-)VBUS

FIG. 4A    VLD = 0

FIG. 4B    VLD = (-)2VBUS

PULSE-WIDTH MODULATED BRIDGE CIRCUIT WITHIN A SECOND BRIDGE CIRCUIT

The present application is based on and claims the benefit of U.S. provisional patent applications No. 60/156,386, filed Sep. 28, 1999, and Ser. No. 60/199,560, filed Apr. 25, 2000, both of which are hereby incorporated by reference in their entirety.

BACKGROUND OF THE INVENTION

The present invention relates to pulse-width modulation systems for causing currents to flow through a load. More particularly, the present invention relates to switching circuits used to control current to the load.

Pulse-width modulation circuits are well known and are used commonly to control current to many types of loads, particularly inductive loads, including servo-amplifiers, brushless motors, other motion control systems and gradient coils in a magnetic resonance imaging (MRI) systems, energy storage devices, to name a few. The pulse-width modulation circuit includes a switching circuit to which the load is connected. The switching circuit, also know commonly as a "bridge" circuit, includes two branches or totems, wherein each branch includes two series connected switching elements. The load is connected across the midpoints of each of the series connected switches and a voltage is applied across each of the branches. By appropriately operating the switching devices, the voltage from the power supply can be placed across the load. As is well known, an average voltage can be obtained by modulating the duty cycle, or the time duration the bridge exists in each of its alternate conductive states. The average voltage is limited by the voltage potential of the power supply.

However, one drawback existing with the conventional bridge circuit used in the pulse-width modulation circuit is the limited voltage that can be applied to the load. In particular, the amplitude of the voltage potential is limited by the breakdown voltage of the switching devices used to construct the bridge. As a result of this voltage limitation, slew rates of an inductive load and the back EMF of a motor load are more difficult to overcome.

There is thus an on-going need for an improved switching circuit used to control current in a pulse-width modulation circuit. An improved bridge circuit that can apply large voltages across the load would be very beneficial.

SUMMARY OF THE INVENTION

A circuit for providing a current through a load includes a first bridge circuit connectable to a load. The bridge circuit selectively applies a voltage across the load. A second bridge circuit is connected to the first bridge circuit and is connectable to a power supply. The second bridge circuit selectively applies voltage to terminals of the first bridge circuit.

Another aspect of the present invention includes a circuit having a nested bridge circuit connectable to a load and a plurality of power sources. The nested bridge circuit comprises a plurality of switching devices. The switching devices are connected together so as to selectively apply a voltage across the load approximately equal to a maximum series connection of the plurality of voltage sources, while a maximum voltage across any one switching device does not exceed a maximum voltage of one of the plurality of power sources.

Yet another aspect of the present invention is a method of operating a pulse width modulating circuit. The pulse width modulating circuit comprises a first bridge circuit connected to a load and a second bridge circuit connected to the first bridge circuit and connected to a power supply. The method includes selectively applying at least two different voltage potentials to terminals of the first bridge through the second bridge; and operating the first bridge to apply an average voltage to the load.

DETAILED DESCRIPTION OF THE ILLUSTRATIVE EMBODIMENTS

Figure 1A:
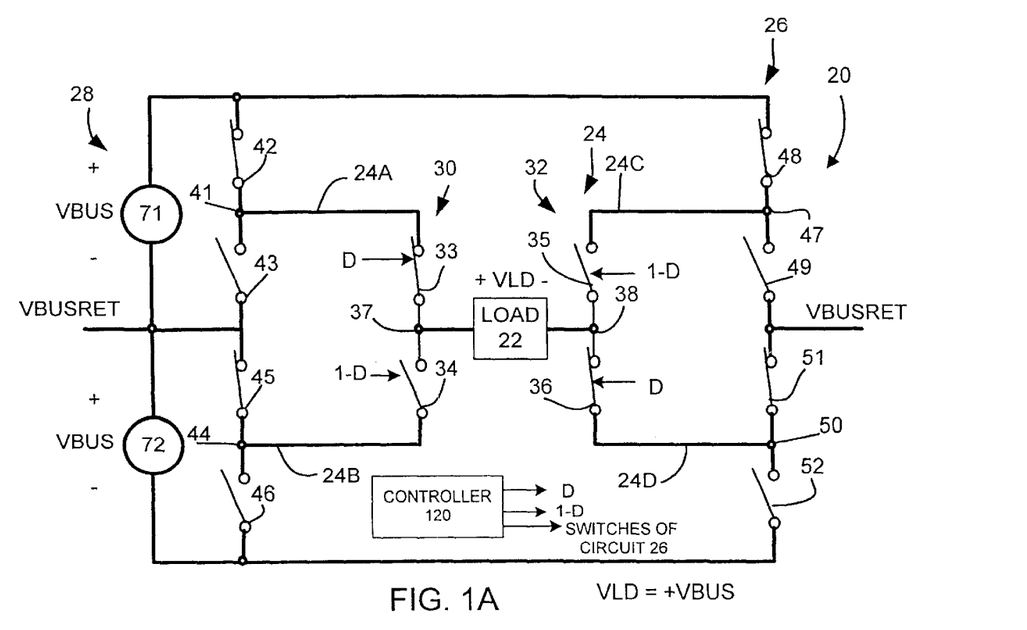
FIG. 1A is a first operating state of a circuit of the present invention.

A first embodiment of a circuit 20 of the present invention for controlling a current through a load 22 is illustrated in FIG. 1A. Generally, the circuit 20 includes a first bridge circuit 24 and a second bridge circuit 26. The first bridge circuit 24 is connectable to the load 22 and selectively applies a voltage, VLD, across the load 22. The second bridge circuit 26 connects to the first bridge circuit 24. The second bridge circuit 26 is connectable to a power supply 28. The second bridge circuit selectively applies voltage to terminals 24A, 24B, 24C or 24D of the first bridge circuit 24.

The first bridge circuit 24 is of conventional design and includes two totems or branches of series connected switching elements. A first branch 30 includes switching elements 33 and 34, while a second branch 32 includes switching elements 35 and 36. The load 22 is connectable across a node 37 formed between switching elements 33 and 34, and a node 38 formed between switching elements 35 and 36.

In a conventional bridge the first bridge 24 would be connected directly to a power supply to receive power therefrom; however, in the circuit 20, the first bridge circuit 24 is connected to the second bridge circuit 26, which in turn, receives power from the power supply 28.

As illustrated, each terminal 24A–24D of the first bridge circuit 24 is connected to a common node formed between the series connected switching elements of the second bridge circuit 26. Specifically, terminal 24A is connected to node 41 formed between switching elements 42 and 43; terminal 24B is connected to node 44 formed between switching elements 45 and 46; terminal 24C is connected to node 47 formed between switching elements 48 and 49; and terminal 24D is connected to node 50 formed between switching elements 51 and 52. In the embodiment illustrated, the power supply 28 comprises a first power Source 71 and a second power source 72. Each power source 71 and 72 provides a voltage potential equal to VBUS. Power sources 71 and 72 are connected in series so as to create a positive supply, +VBUS, with respect to a return, VBUSRET, and a negative supply (−)VBUS, with respect to VBUSRET. Switching elements 42 and 48 are connected to a positive terminal of power source 71, while switching elements 46 and 52 are connected to a negative terminal of power source 72. As illustrated, each of the switches 43, 45, 49 and 51 are connected to VBUSRET. The switching elements 33–36, 42, 43, 45, 46, 48, 49, 51 and 52 can comprise any form of switching device such as MOSFETs, IGBTs, bipolar transistor, diodes, gate turnoff thyristor, etc.

FIGS. 1A, 1B, 2A, 2B, 3A, 3B, 4A and 4B illustrate different operating states of the circuit 20. Generally, FIGS. 1A, 1B, 3A and 3B illustrate operation where voltages applied across the load 22 are approximately within the range of (−)VBUS to +VBUS, while FIGS. 2A, 2B, 4A and 4B illustrate operation where voltages between (−)2VBUS to +2VBUS are applied across the load 22. However, although higher voltages are applied to the load 22 in these operating conditions, the voltage stresses placed on the switching elements 33–36, 42, 43, 45, 46, 48, 49, 51 and 52 are limited to VBUS, which are the same as those of a conventional bridge.

As discussed above, FIGS. 1A, 1B, 3A and 3B illustrate operation of the circuit 20 when voltages in the range of approximately (−)VBUS to +VBUS are applied across load 22 to maintain load current. When a voltage greater than +VBUS is required across the load 22, the second bridge 26 is then changed to the configuration in FIGS. 2A and 2B. When a voltage greater than approximately +VBUS is no longer required, the second bridge 26 returns to the configuration illustrated in FIGS. 1A, 1B, 3A and 3B. If a voltage lower than approximately (−)VBUS is required across the load 22 to maintain load current, the second bridge 26 will then be changed to the configuration illustrated in FIGS. 4A and 4B. When a voltage less than approximately (−)VBUS is no longer required, the second bridge 26 will return to the configuration illustrated in FIGS. 1A, 1B, 3A and 3B.

Capacitors 91 are placed across the first bridge 24 to maintain voltage across the first bridge 24 as the second bridge 26 commutates between operating states and as current flows in and out of the first bridge 24 during normal switching action.

Figure 5:
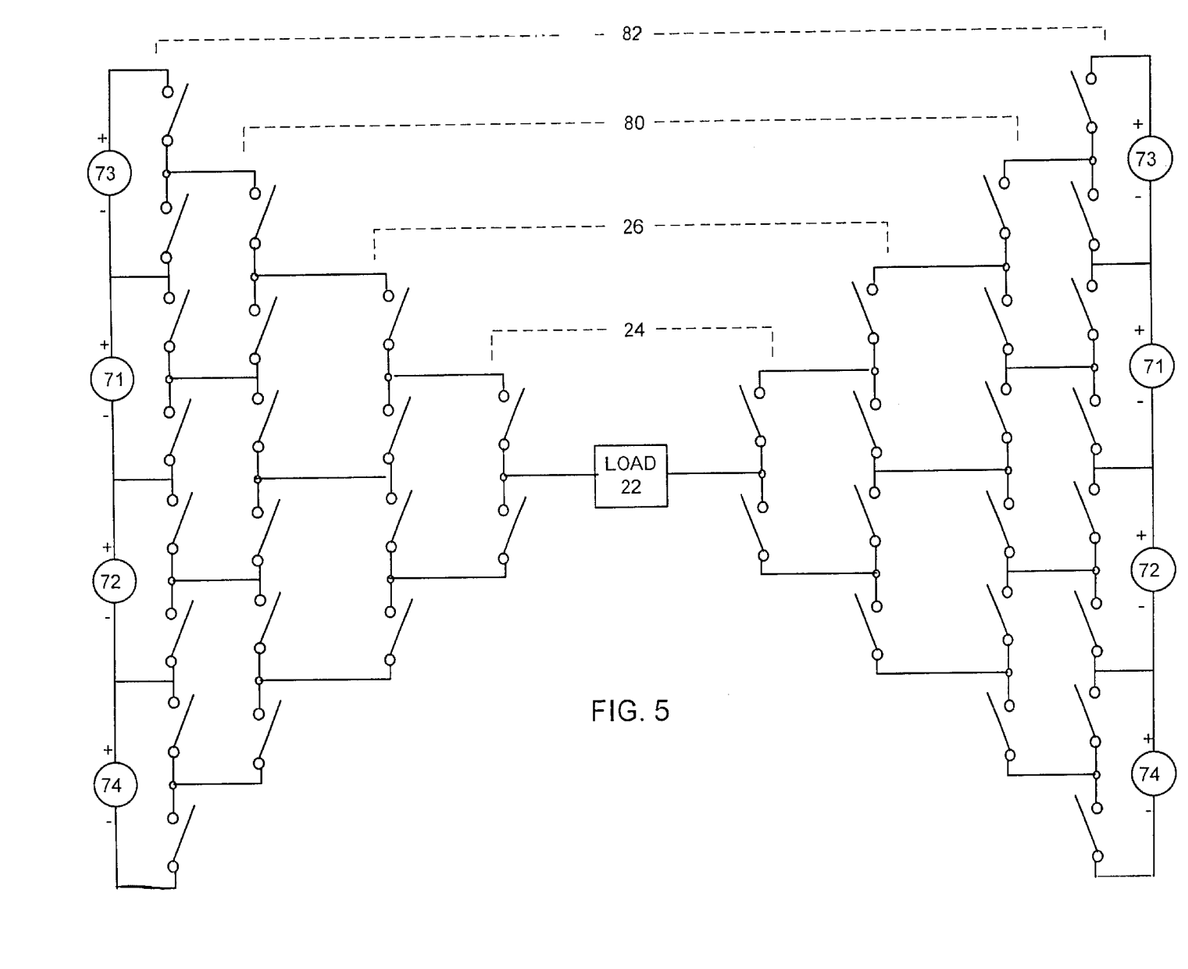
FIG. 5 is a circuit illustrating nested bridges.

Although illustrated where circuit 20 includes two bridges 24 and 26, the design and techniques described herein can be expanded to include more levels of "nested" bridges. FIG. 5 illustrates four levels of nested bridges including bridge 24, bridge 26, a bridge 80 and a bridge 82. Four power supplies 71, 72, 73 and 74, which are approximately equal in amplitude (e.g. VBUS) and which can be isolated from each other, can be selectively connected to provide up to ±4VBUS across load 22. However, as in the circuit 20 described above the voltages stresses experienced by any switching element is limited to VBUS. As appreciated by those skilled in the art, three nested levels of bridges or five or more nested level of bridges can also be constructed and operated in accordance with the present invention.

Figure 1B:
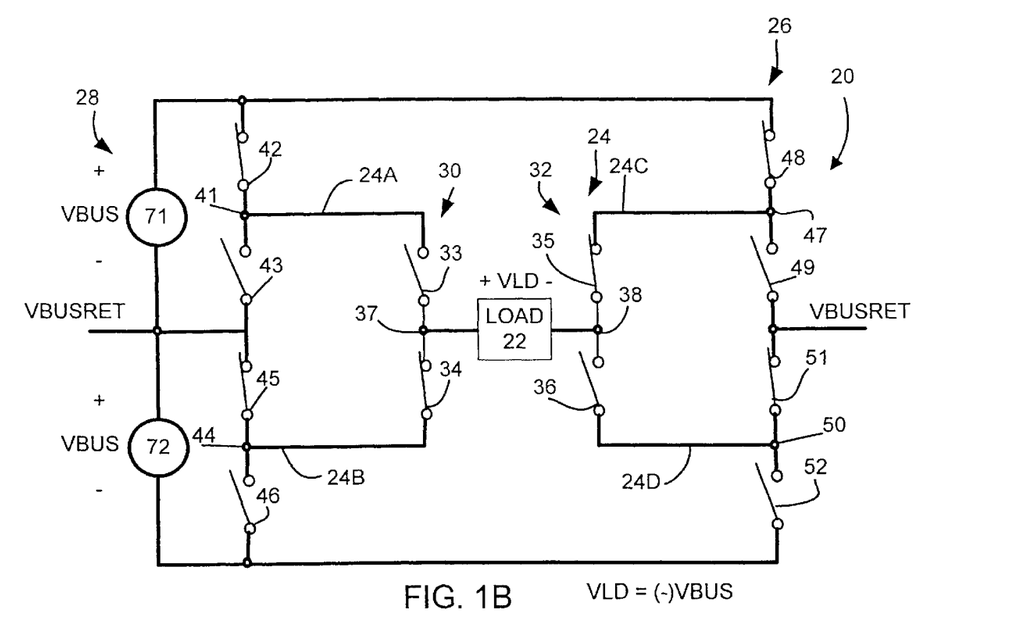
FIG. 1B is a second operating state of the circuit.
Figure 8:
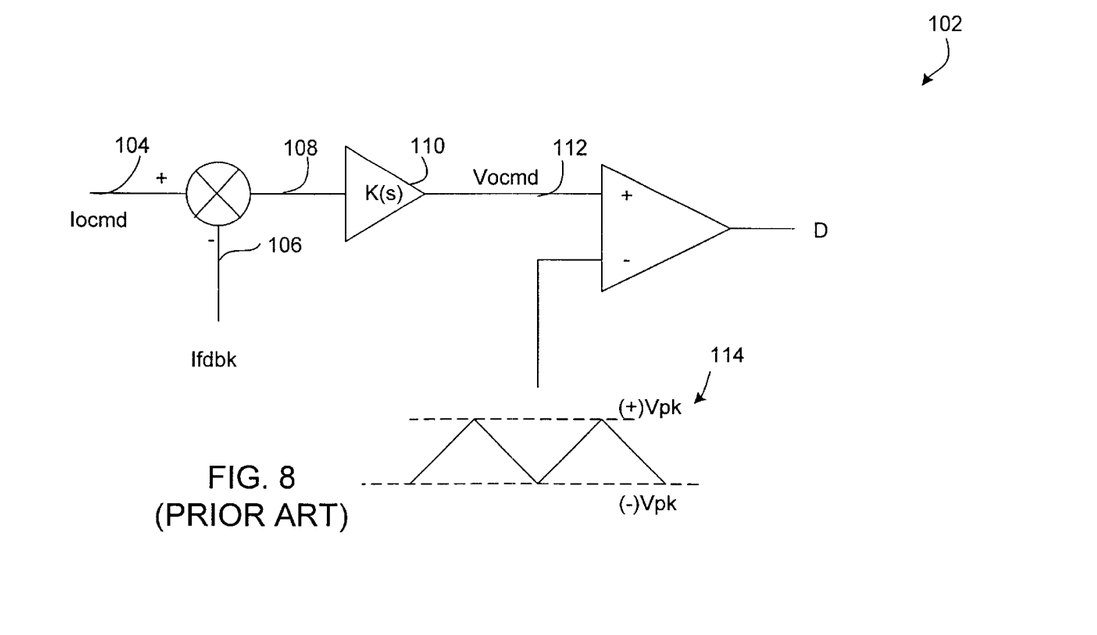
FIG. 8 is a prior art current control loop.

A current control loop 100 controls current delivered by the circuit 20 to the load 22. Referring first to FIG. 8 a current control loop 102 of a conventional bridge compares a current command signal 104 with a current being delivered by the bridge on signal line 106. (The current signal 106 is obtained in any known manner, such as from one or more current sensing devices, for example, current transformers, not shown). The difference between signals 104 and 106 is commonly represented as an error voltage 108. An amplifier 110 commonly amplifies and frequency compensates the error voltage 108 to form or create a voltage command signal 112, Vocmd. The voltage command signal 112 is then compared with a reference signal such as a triangle wave voltage 114. If the voltage command signal 112 is greater than the reference voltage 114 the conventional bridge is controlled to operate on a first conducting state, and if the voltage command signal 112 is less than the reference voltage 114 the bridge is operated to be placed in a second conducting state. (Configuration of the first bridge circuit 24 in FIGS. 1A and 1B illustrate the operating states of the conventional bridge). By rapidly switching between these two conducting states, an average voltage can be generated across the load that will cause a current to flow substantially equal to the current command signal 104. Modulation between the two conducting states is known as the pulse-with-modulation action of the bridge. The ratio of the time in the first conducting state to the total switching period (period of the reference voltage 114) is known as the duty cycle, D.

The duty cycle, D, is limited in range from zero to one. The duty cycle is also the ratio:

$$D=(Vocmd-(-)Vpk)/(+Vpk-(-)Vpk) \qquad \text{EQ. 1}$$

Therefore for Vocmd=(−)Vpk;

$$D=((-)Vpk-(-)Vpk/(+Vpk-(-)Vpk)=0$$

and for Vocmd=+Vpk;

$$D=(+Vpk-(-)Vpk/(+Vpk-(-)Vpk)=1$$

Since Vocmd is the output of the compensation amplifier 110, which ensures stable operation of the current loop, Vocmd, and therefore, D, cannot change instantaneously.

For a conventional bridge, the average voltage placed across the load, Vld, is related to D and VBUS, as illustrated in the following equation:

$$Vld=(2\times D-1)\times VBUS \qquad \text{EQ. 2}$$

Such that for D=0;

$$Vld=(2\times 0-1)\times VBUS=(-)VBUS$$

and for D=1;

$$Vld=(2\times 1-1)\times VBUS=VBUS$$

Figure 9:
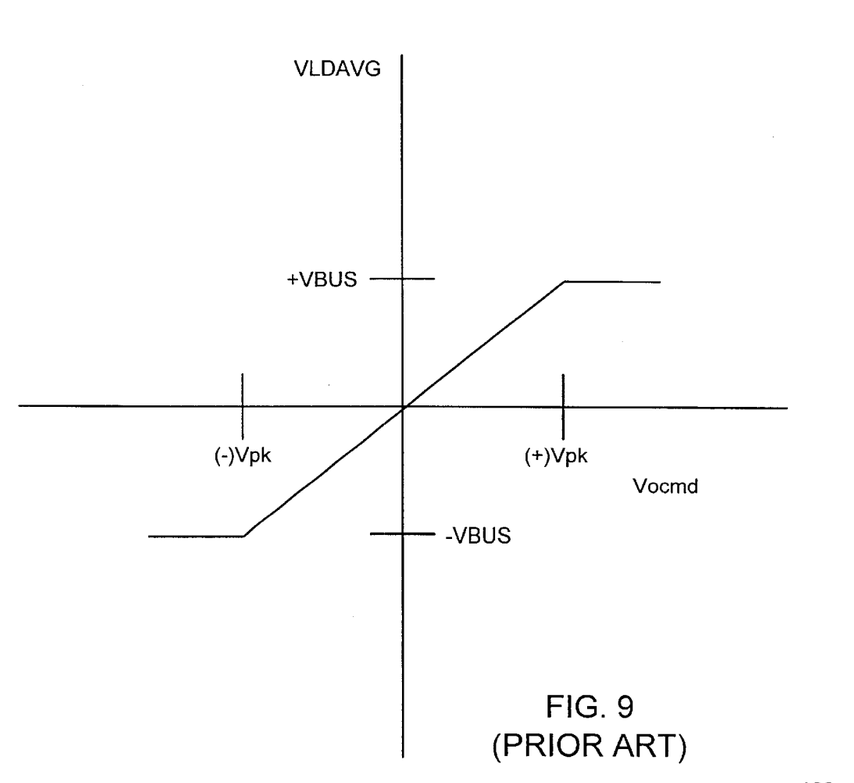
FIG. 9 is an operating plot of the prior art current control loop.

The conventional bridge saturates (applies +VBUS or (−)-VBUS across the load an no longer modulates) when Vocmd is equal to or greater than the positive peak voltage of the reference triangular waveform 114 +Vpk, or when Vocmd is equal to or less than the negative peak voltage of the triangular waveform 114, (−)Vpk (FIG. 9). Referring back to the present invention, when the second bridge circuit 26 changes states to enable the first bridge circuit 24 to apply voltages greater than +VBUS or less than (−)VBUS across the load 22, a step voltage change can be imposed across the load 22. Depending on what state the second bridge circuit 26 transitions to, the new average load voltage across the load 22 will be that of either equation 3 (FIGS. 2A and 2B) or equation 4 (FIGS. 4A and 4B):

$$Vld = 2 \times D \times VBUS \quad \text{EQ. 3}$$

Such that for D=0;

$$Vld = 2 \times 0 \times VBUS = 0$$

and for D=1;

$$Vld = 2 \times 1 \times VBUS = 2VBUS$$

$$Vld = 2 \times D \times VBUS \quad \text{EQ. 4}$$

Such that for D=0;

$$Vld = -2 \times (1-0) \times VBUS = -2VBUS$$

and for D=1;

$$Vld = (D=1) = -2 \times (1-1) \times VBUS = 0$$

However, since Vocmd and therefore the duty cycle, D, cannot change instantaneously after the second bridge circuit 26 makes a transition, a step change in voltage appears across the load 22. A step change in voltage across the load 22 creates a large unwanted perturbation in the current flowing through the load 22, which should be dealt with by the current control loop. If the response of the current control loop is not fast enough, excessive current can flow causing damage to the circuit 20, the circuit 20 to shut down, or unwanted currents to flow in the load 22.

The control current loop 100 compensates for the step change in voltage as described above. Generally, an offset voltage equal to plus or minus half of the peak-to-peak voltage of the reference voltage 114 is summed with Vocmd at the instant the second bridge circuit 26 changes states. Addition of the offset voltage creates a shift in D such that Vld remains the same before and after the transition of the second bridge circuit 26. Since the load voltage Vld across the load 22 does not change significantly, there is no perturbation in load current.

Figure 7:
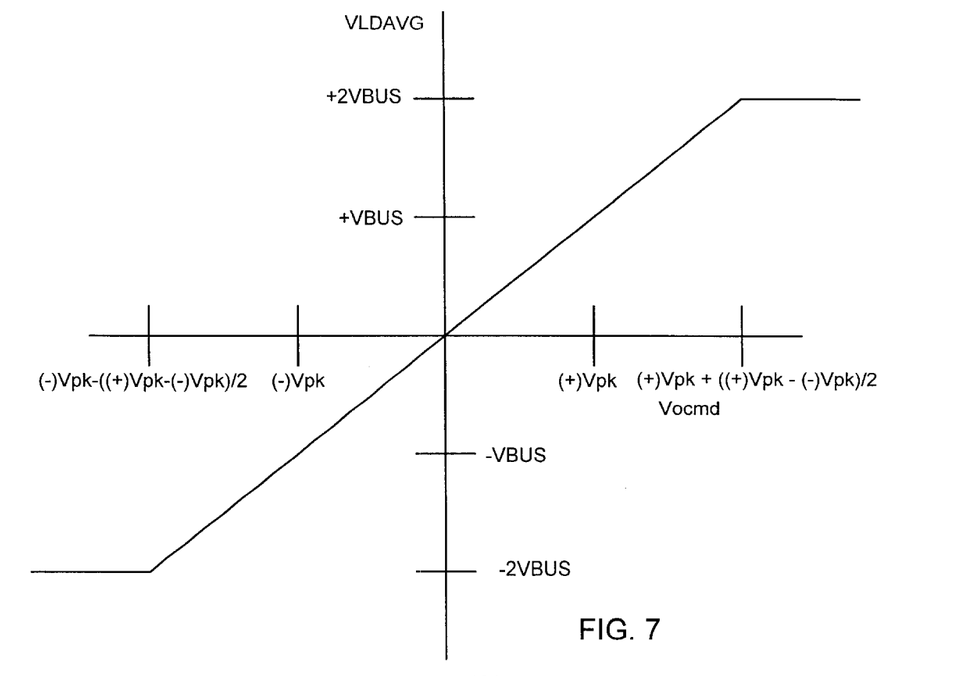
FIG. 7 is an operating plot of the current control loop.

When the second bridge circuit 26 is configured as illustrated in FIGS. 1A, 1B, 3A and 3B, the first bridge circuit 24 will saturate as Vocmd approaches the positive or negative peaks of the reference waveform 114, allowing the range of voltages from (−)VBUS to +VBUS to be placed across the load 22 (FIG. 7). If a load voltage greater than +VBUS is required, an offset voltage equal to minus half of the peak-to-peak voltage of the triangular wave form 114 is summed with Vocmd when the second bridge circuit 26 transitions to the configuration illustrated in FIGS. 2A and 2B. The duty cycle, D, can be described by the following equation:

$$D = [\{Vocmd - (+Vpk - (-)Vpk)/2\} - (-)Vpk]/(+Vpk - (-)Vpk) \quad \text{EQ. 5}$$

The first bridge circuit 24 goes into saturation as Vocmd approaches the midpoint of the triangular waveform 114 or +Vpk plus half the peak-to-peak voltage of the triangular waveform 114, allowing from zero volts to +2VBUS to be placed across the load 22.

Figure 4A:
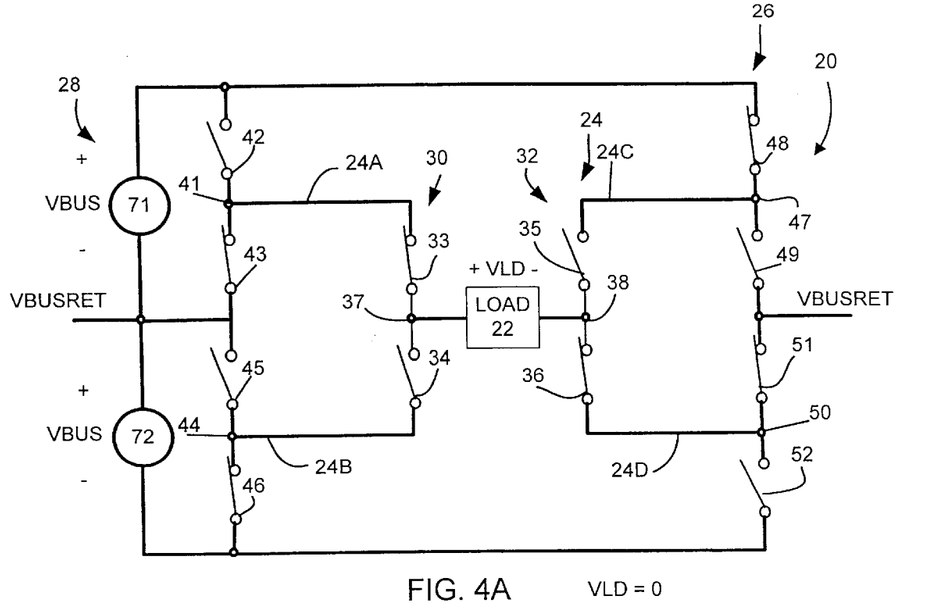
FIG. 4A is a seventh operating state of the circuit.
Figure 4B:
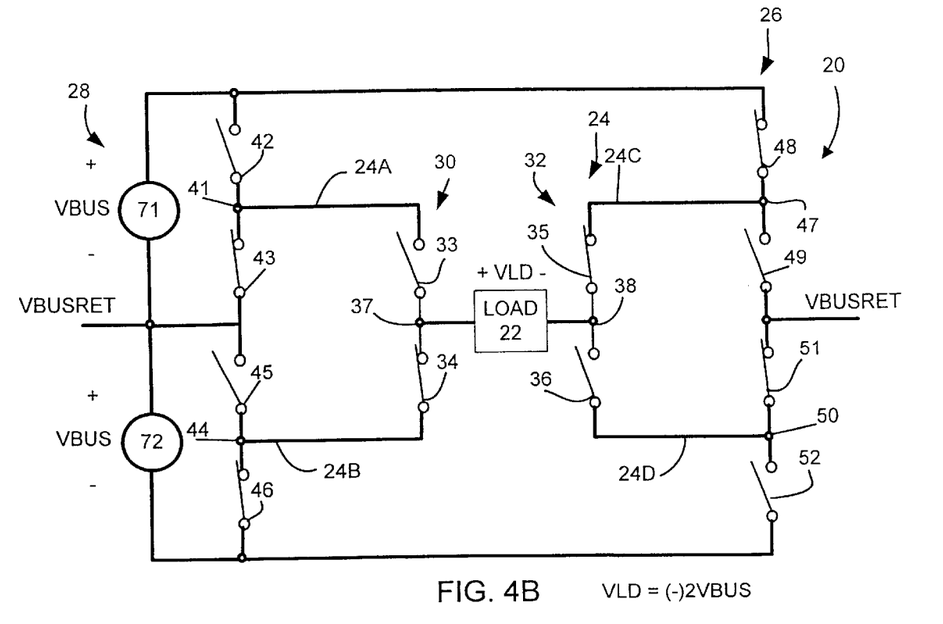
FIG. 4B is an eighth operating state of the circuit.

If on the other hand, a low voltage less than (−)VBUS is required, an offset voltage equal to plus half of the peak-to-peak voltage of the triangular waveform 114 is summed with Vocmd when the second bridge circuit 26 transitions to the configuration illustrated in FIGS. 4A and 4B. The duty cycle, D, can be represented by the following equation:

$$D = [\{Vocmd + (+Vpk - (-)Vpk)/2\} - (-)Vpk]/(+Vpk - (-)Vpk) \quad \text{EQ. 6}$$

The first bridge circuit 24 goes into saturation as Vocmd approaches the midpoint of the triangular waveform 114 or (−)Vpk minus half the peak-to-peak voltage of the triangular waveform 114, allowing from (−)2VBUS to zero volts to be placed across the load 22.

A decision as to when to reconfigure the second bridge circuit 26 can be based on different criteria. For example, the load voltage Vld can be monitored directly or estimated and used as a basis for reconfiguration. For instance, in a motor load an estimate of the backemf of the motor based on motor speed can be used. In the example below, Vocmd can be used to indicate when to shift configurations by sensing when Vocmd is near levels that would cause the first bridge circuit 24 to saturate. If the second bridge circuit 26 is configured as illustrated in FIGS. 1A, 1B, 3A and 3B and Vocmd is at +Vpk−0.05×(+Vpk−(−)Vpk), the first bridge circuit 24 is close to saturation in the positive direction. Upon reaching this condition, the second bridge circuit 26 can then be placed in the configuration in FIGS. 2A and 2B, and the negative offset voltage summed with Vocmd. The first bridge circuit 24 will remain out of saturation as long as Vocmd is less than +Vpk+(+Vpk−(−)Vpk)/2.

As the voltage across the load 22 decreases, the amplitude of Vocmd can again be used to determine when the second bridge circuit 26 should be changed back to the configuration illustrated in FIGS. 1A, 1B, 3A and 3B. When Vocmd is at, for example, +Vpk−0.45×(+Vpk−(−)Vpk) or near the midpoint of the triangular waveform 114, the first bridge circuit 24 is again approaching saturation and the second bridge circuit 26 can be returned to the states illustrated in FIGS. 1A and 1B.

The same situation occurs when the circuit 20 is applying negative voltages across the load 22. If the second bridge circuit 26 is configured as illustrated in FIGS. 1A, 1B, 3A and 3B, and Vocmd is at (−)Vpk+0.05×(+Vpk−(−)Vpk), the first bridge circuit 24 is approaching saturation from a negative perspective. At this point, the second bridge circuit 26 can be shifted to the configuration in FIGS. 4A and 4B and a positive offset voltage can be summed with Vocmd. The first bridge circuit 24 will remain out of saturation as long as Vocmd is less than (−)Vpk−(+Vpk−(−)Vpk)/2.

Figure 3A:
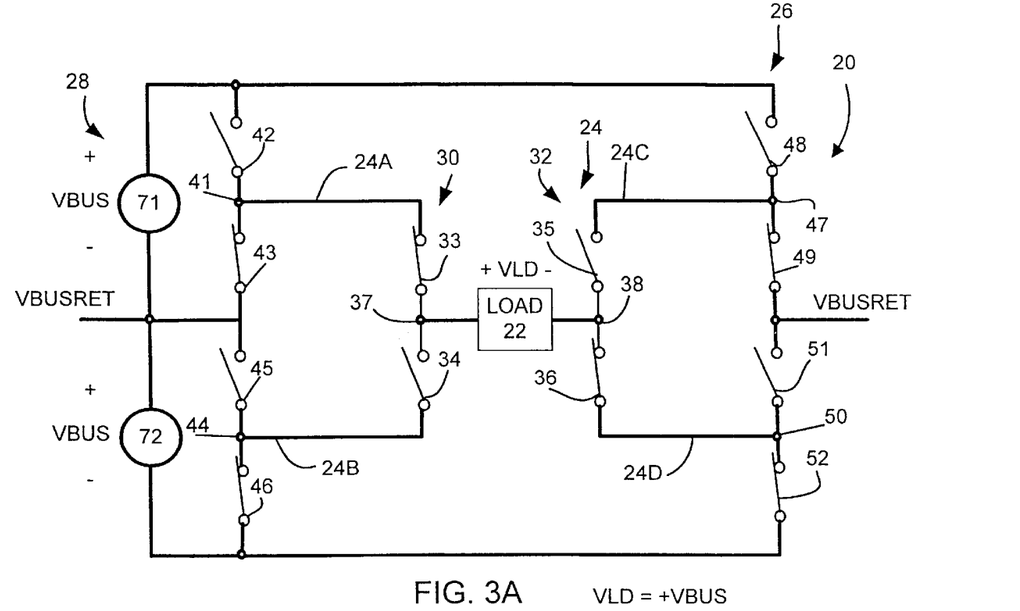
FIG. 3A is a fifth operating state of the circuit.
Figure 3B:
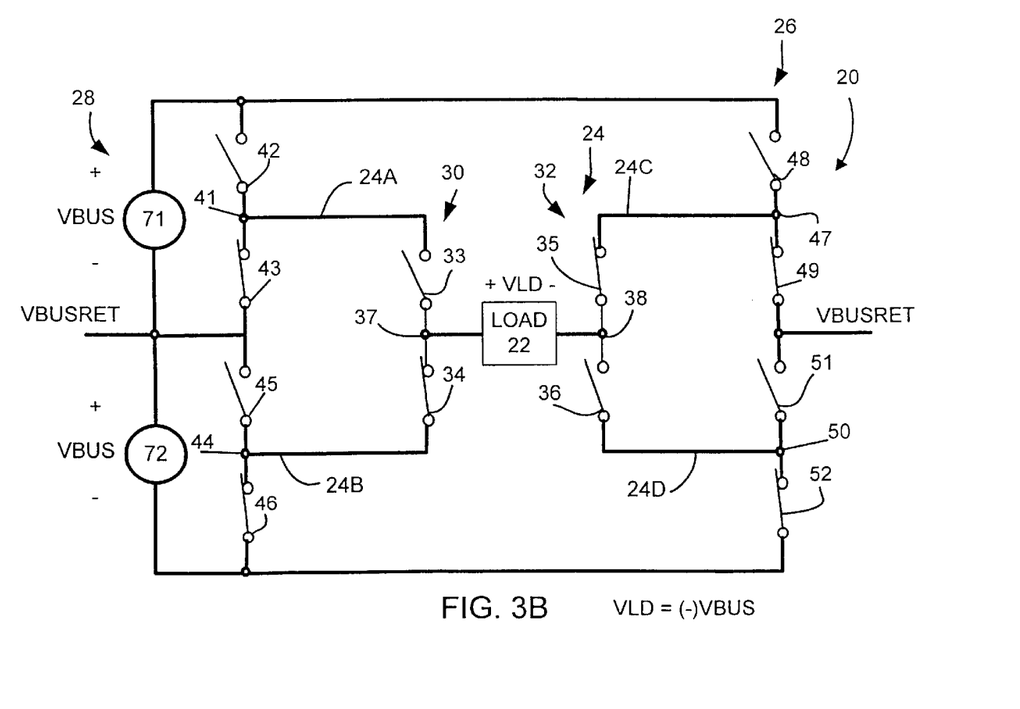
FIG. 3B is a sixth operating state of the circuit.

As the voltage requirement across the load 22 increases, the amplitude of Vocmd can be used to determine when the second bridge circuit 26 should be changed back to the configuration illustrated in FIGS. 1A, 1B, 3A and 3B. When Vocmd is at (−)Vpk+0.45×(+Vpk−(−)Vpk), or near the midpoint of the triangular waveform 114, the first bridge circuit 24 is approaching saturation and the second bridge circuit 26 can be configured as illustrated in FIGS. 3A and 3B.

Figure 6:
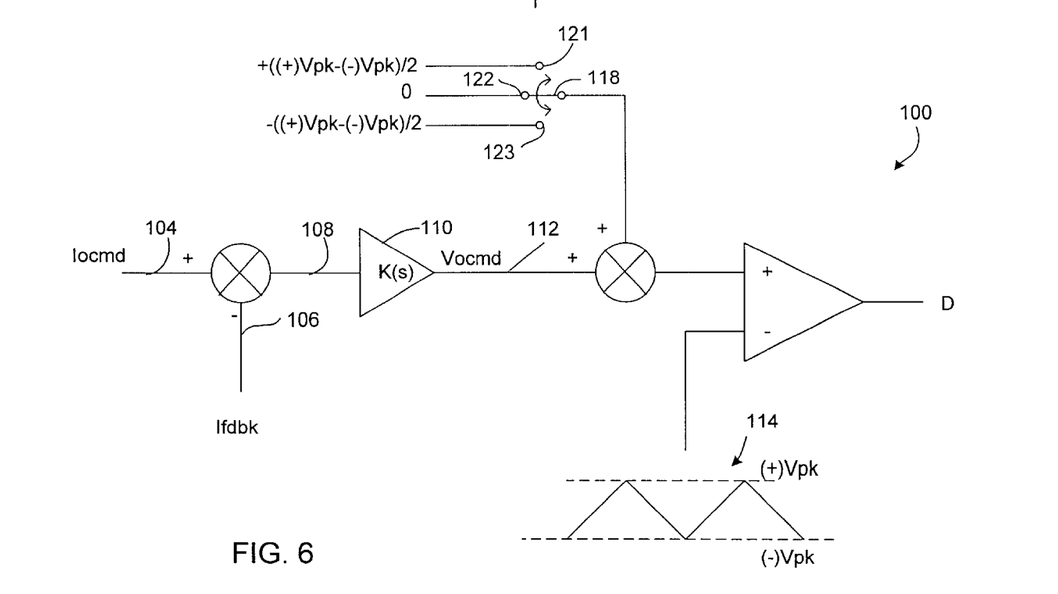
FIG. 6 is a current control loop.

Referring to FIG. 6, a switch 118 represents selective summation of the offset voltage. Switch 118 can be selectively positioned at 121, 122 and 123. Switch 118 is operated according to the following conditions:

Set switch 118 to 123 if Vocmd=+Vpk−0.05(+Vpk−(−)Vpk)

Reset switch 118 to 122 if Vocmd=+Vpk−0.45(+Vpk−(−)Vpk)

Set switch 118 to 121 if Vocmd=−Vpk+0.05(+Vpk−(−)Vpk)

Reset switch 118 to 122 if Vocmd=−Vpk−0.45(+Vpk−(−)Vpk)

In the situation described above, a hysteresis voltage, for example, 0.4×(+Vpk−(−)Vpk) volts can be used in the decision of when to change into or out of the states for the second bridge circuit to ensure that the second bridge circuit is not changing states many times when Vocmd is at the shift threshold, which could cause excessive heating of the switching elements.

It should be noted that the values of 0.5, 0.45 and 0.4 as described above are illustrative values wherein other values may be used for each of these selected thresholds. A controller 120 (FIG. 3) implements the current control loop 100 and the logic described above to control the switching elements of circuits 24 and 26. The functional blocks, switches and values of the controller 120 can be implemented using hardware (analog or digital circuits) and/or suitable routines or modules executable on a processor such as a digital signal processor.

The following examples are illustrative of various operation states for circuit 20. In these examples it is assumed that the triangle waveform 114 is symmetric around 0 such that (+)Vpk=−(−) Vpk=Vpk=((+)Vpk−(−)Vpk)/2.

EXAMPLE 1

The second bridge 26 is configured as shown in FIGS. 1A, 1B, 3A and 3B.

$$Vocmd = 0.90 \times (+)Vpk$$

$$D = ((0.90 \times (+)Vpk) - (-)Vpk)/(2 \times Vpk) \text{(using eq. 1)}$$
$$= (0.90 \times Vpk + Vpk)/(2 \times Vpk)$$
$$= 1.90/2$$
$$= 0.95$$

$$Vld = (2 \times 0.95 - 1)VBUS \text{(using eq. 2)}$$
$$= (1.90 - 1) \times VBUS$$
$$= 0.90 \, VBUS$$

Figure 2A:
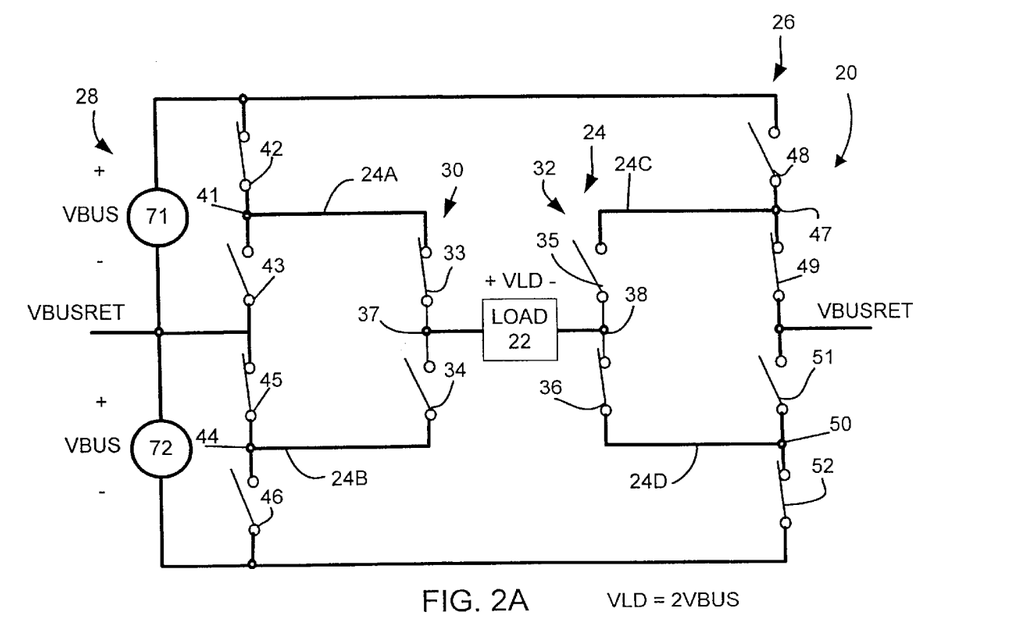
FIG. 2A is a third operating state of the circuit.
Figure 2B:
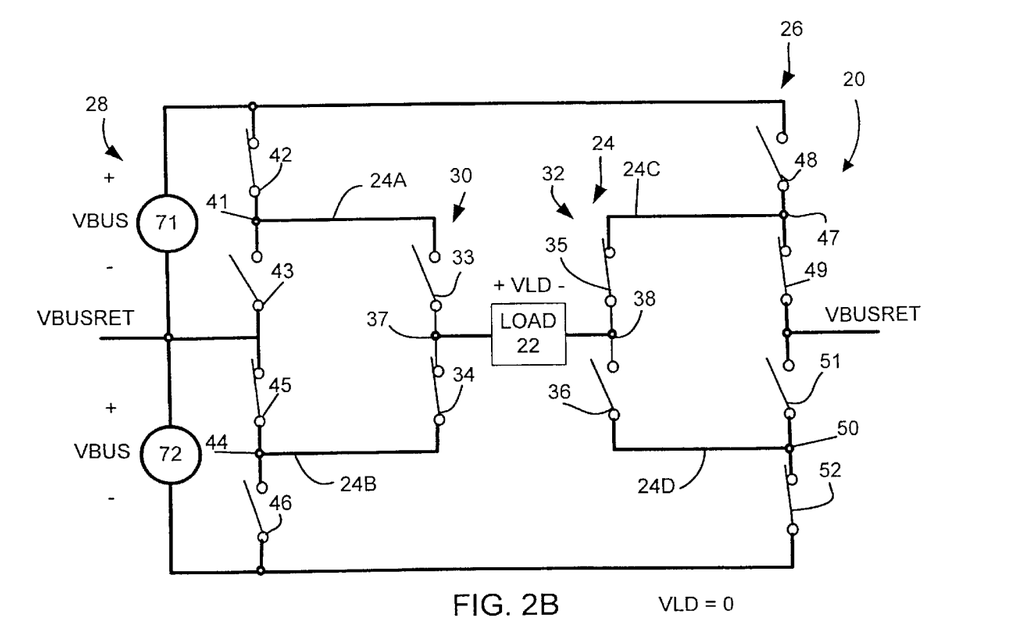
FIG. 2B is a fourth operating state of the circuit.

The second bridge 26 reconfigures as shown in FIGS. 2A and 2B, and (−)Vpk is summed with Vocmd in the control loop 102.

$$Vocmd = 0.9 \times (+)Vpk$$

(remains unchanged immediately before and after the shift)

$$D = ((0.90 \times (+)Vpk) - Vpk - (-)Vpk)/(2 \times Vpk) \text{(using eq. 5)}$$
$$= (0.90 \times Vpk - Vpk + Vpk)/(2 \times Vpk)$$
$$= 0.90/2$$
$$= 0.45$$

$$Vld = 2 \times 0.45 \times VBUS \text{(using eq. 3)}$$
$$= .9 \, VBUS$$

Note that the load voltage, Vld, remains the same before and after the shift with no change in Vocmd.

EXAMPLE 2

The second bridge 26 is configured as shown in FIGS. 2A and 2B.

$$Vocmd = 0.90 \times (-)Vpk$$

$$D = ((0.90 \times (-)Vpk) - (-)Vpk/(2 \times Vpk) \text{(using eq. 1)}$$
$$= (-0.90 \times Vpk + Vpk)/(2 \times Vpk)$$

-continued
$$= 0.10/2$$
$$= 0.05$$

$$Vld = (2 \times 0.05 - 1)VBUS \text{(using eq. 2)}$$
$$= (0.10 - 1) \times VBUS$$
$$= -0.90 \, VBUS$$

The outer bridge reconfigures as shown in FIGS. 4A and 4B and (+)Vpk is summed with Vocmd in the control loop 102.

$$Vocmd = 0.9 \times (-)Vpk$$

(remains unchanged immediately before and after the shift)

$$D = ((0.9 \times (-)Vpk) + Vpk - (-)Vpk)/(2 \times Vpk) \text{(using eq. 6)}$$
$$= (-0.90 \times Vpk + Vpk + Vpk)/(2 \times Vpk)$$
$$= 1.10/2$$
$$= 0.55$$

$$Vld = -2 \times (1 - 0.55) \times VBUS \text{(using eq. 4)}$$
$$= -2 \times .45 \times VBUS$$
$$= -0.90 \, VBUS$$

Note that in both cases the load voltage, Vld, remains the same before and after the shift with no change in Vocmd. In both examples, no action is required of the control loop to change Vocmd and therefore Vld, to maintain smooth control of the current.

From the foregoing, it should be also understood that the first bridge circuit 24 will operate at a higher frequency (changing from one state to the other) than the second bridge circuit 26. Generally, the second bridge 26 transitions when the voltage required across the load is greater than or less than approximately VBUS. This requirement should occur at the command frequency, which for a pulse-width-modulation circuit is significantly less than the pulse-width-modulation switching frequency. Therefore, the switching losses associated with the second bridge 26 are at the command frequency, and not the pulse-width-modulation frequency thereby greatly reducing the losses associated with the second bridge circuit 26.

Proper operation of the second bridge circuit 26 is necessary to prevent overstressing the switching elements due to overcurrent and/or overvoltage. The sequence in which the second bridge 26 switching elements change state is dependent on the initial state of the switching elements of both the first bridge 24 and the second bridge 26, but the sequence is not dependent on the direction of current flowing into or out of the first bridge 24. However, the point during the sequencing when the voltage on various nodes transitions and when the current through various devices commutates, is dependent on the direction of current flow. It should also be noted that the first bridge 24 should not be allowed to change state during the sequencing of the second bridge 26.

Figure 9A:
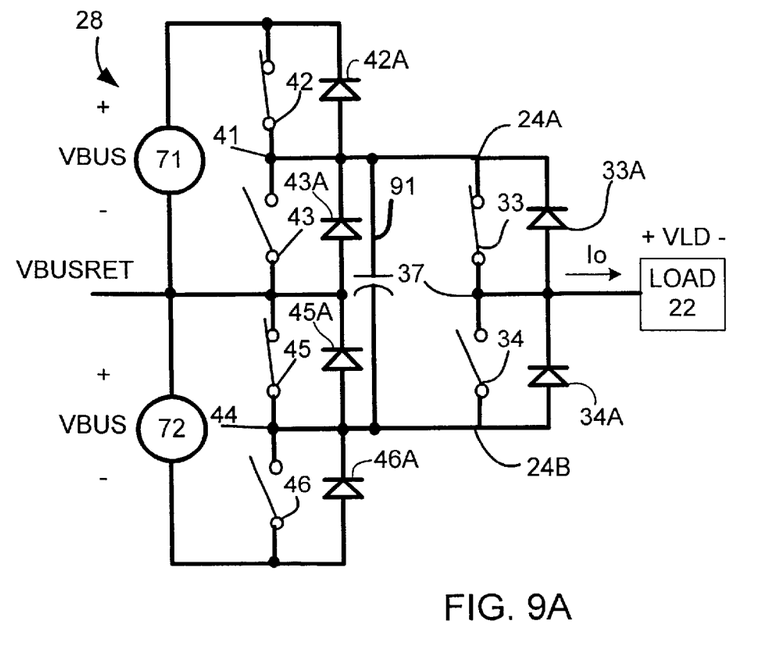
FIG. 9A is a schematic diagram of half of the circuit of the present invention illustrating a first operating state.
Figure 9B:
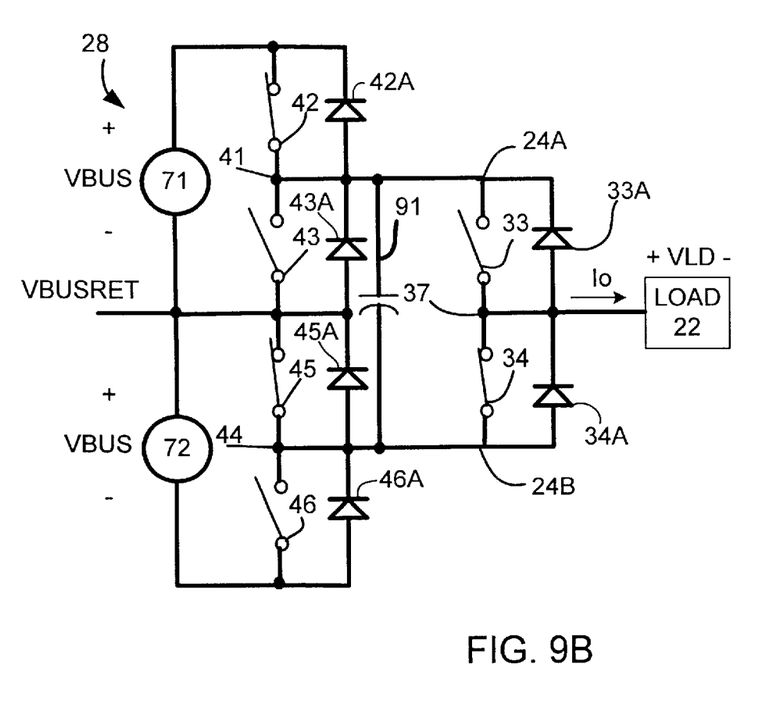
FIG. 9B illustrates a second operating state.
Figure 10A:
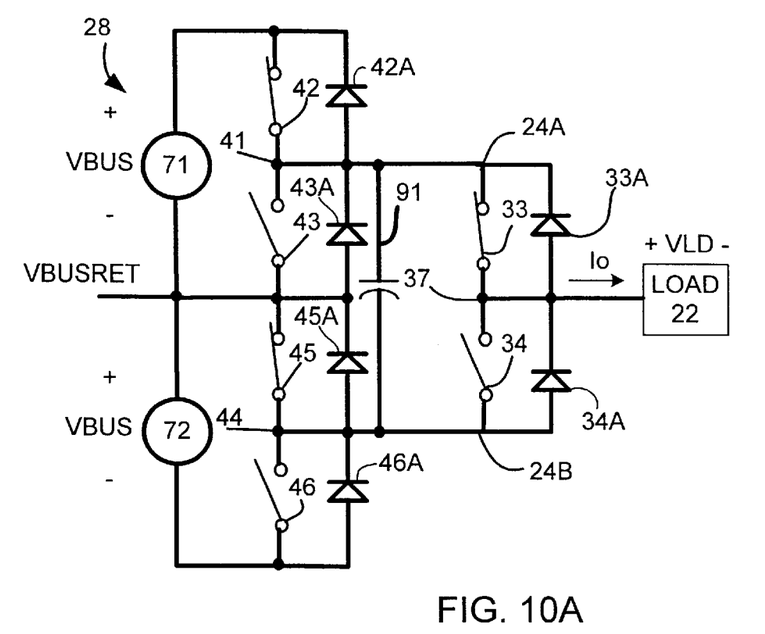
FIG. 10A illustrates a third operating state.
Figure 10B:
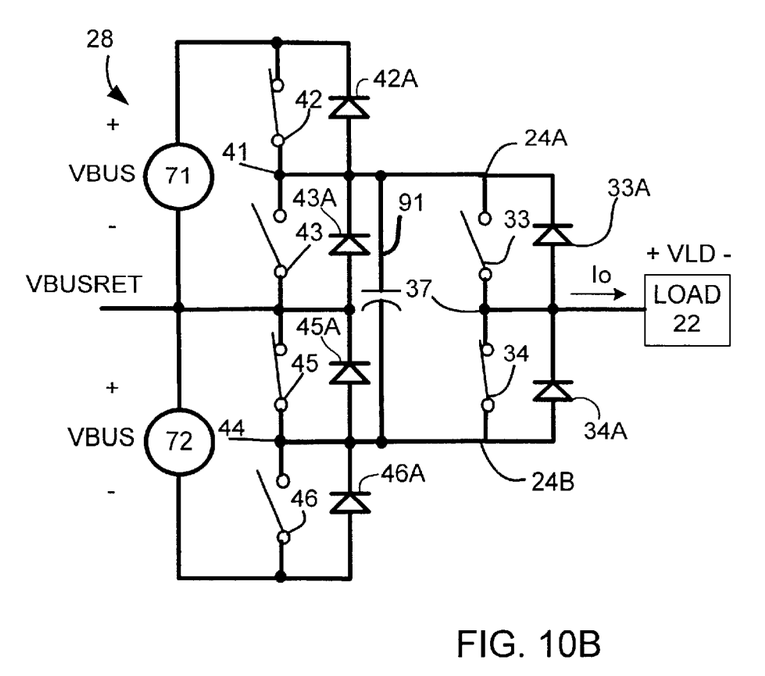
FIG. 10B illustrates a fourth operating state.

Circuit 20 state transitions are illustrated in FIGS. 9A, 9B, 10A and 10B. In each of these figures, only one side of the circuit 20 is required for explanation. Transition between FIGS. 9A and 9B, or between FIGS. 10A and 10B, are sequences that take place during normal modulation of the first bridge circuit 24. However, a transition from the state of FIG. 9A to the state of FIG. 10A, from the state of FIG. 10A to the state of FIG. 9A, from the state of FIG. 9B to the state of FIG. 10B, or from the state of FIG. 10B to the state of FIG. 9B, requires that the switches in the second bridge 26 be opened and closed, preferably, in a specific order.

In the operating states of FIGS. 9A, 9B, 10A and 10B, diodes 33A, 34A, 42A, 43A, 45A and 46A are illustrated. Switching elements of the other half of circuit 20 would include similar diodes. As discussed below, diodes 33A, 34A, 42A, 43A, 45A and 46A clamp or force nodes connected thereto to specific voltage levels.

A transition from the state of FIG. 9A to the state of FIG. 10A requires the following sequence:

1. Open switching element 45;
2. Open switching element 42;
3. Close switching element 43; and
4. Close switching element 46.

If Io is positive during the sequence, current will initially be going down through switching element 42 and switching element 33, and node 24A, and therefore, the output node 37 will be at +VBUS. As soon as switching element 42 opens, current will be forced up through diode 43A, clamping nodes 24A and 37 to VBUSRET.

If Io is negative during the sequence, current will initially be going down through diodes 33A and 42A and nodes 24A and 37, will be at +VBUS. As soon as switching element 43 closes, current will flow down through switching element 43, clamping nodes 24A and 37 to VBUSRET.

In both conditions of current flow, the voltage across capacitor 91 will initially be at +VBUS. When node 24A transitions, node 24B will be forced negative. If (–)VBUS is less than +VBUS, a current will flow through diode 46A to force voltage across the capacitor 91 to be equal to (–)VBUS. If (–)VBUS is greater than +VBUS, a current will flow when switching element 46 closes to force the voltage across capacitor 91 to be equal to (–)VBUS. To minimize this current flow, the magnitude of +VBUS and (–)VBUS should be very close to each other.

The transition from the state of FIG. 10A to the state of FIG. 9A requires the following sequence:

1. Open switching element 46;
2. Open switching element 43;
3. Close switching element 42; and
4. Close switching element 45.

If Io is positive during this sequence, current will initially be going up through diode 43A and down through switching element 33, and node 24A, and therefore, the output node 37 will be at VBUSRET. As soon as switching element 42 closes, current will flow down switching element 42, clamping nodes 24A and 37 to +VBUS.

IF Io is negative during the sequence, current will initially be going up through diode 33A and down through switching element 43, and nodes 24A and 37, will be at VBUSRET. As soon as switching element 43 opens, current will be forced up diode 42A, clamping nodes 24A and 37 to +VBUS.

In both conditions of current flow, the voltage across capacitor 91 will initially be at (–) VBUS. When node 24A transitions, node 24B will be forced positive. If (–)VBUS is less than +VBUS, a current will flow through diode 45A to force the voltage across capacitor 91 to be equal to +VBUS. If (–)VBUS is greater than +VBUS, a current will flow when switching element 45 closes to force the voltage across capacitor 91 to be equal to +VBUS.

A transition for the state of FIG. 9B to the state of FIG. 10B requires the following sequence:

1. Open switching element 42;
2. Open switching element 45;
3. Close switching element 46; and
4. Close switching element 43.

If Io is positive during the sequence, current will initially be going down through switching element 45 and up through diode 34A, and node 24A, and therefore, the output node 37 will be at VBUSRET. As soon as switching element 45 opens, current will be forced up through diode 46A, clamping nodes 24A and 37 to (–)VBUS.

If Io is negative during the sequence, current will initially be going up through switching element 34 and up through diode 45A, and nodes 24A and 37, will be at VBUSRET. As soon as switching element 46 closes, current will flow down through switching 46, clamping nodes 24A and 37 to (–)VBUS.

In both conditions of current flow, voltage across capacitor 91 will initially be at +VBUS. When node 24B transitions, node 24A will be forced negative. If (–)VBUS is less than +VBUS, a current will flow when switching element 43 closes to force the voltage across capacitor 91 to be equal to (–)VBUS. If (–)VBUS is greater than +VBUS, a current will flow through diode 43A to force the voltage across capacitor 91 to be equal to (–)VBUS.

The transition from the state of FIG. 10B to the state of FIG. 9B requires the following sequence:

1. Open switching element 43;
2. Open switching element 46;
3. Close switching element 45; and
4. Close switching element 42.

IF Io is positive during the sequence, current will initially be going up through diode 46A and diode 34A, and node 24A, and therefore, the output node 37 will be at (–)VBUS. As soon as switching element 45 closes, current will flow down through switching element 45, clamping nodes 24B and 37 to VBUSRET.

If Io is negative during the sequence, current will initially be going down through switching element 34 and switching element 46, and nodes 24B and 37 will be at (–)VBUS. As soon as switching element 46 opens, current will be forced up through diode 45A, clamping nodes 24B and 37 to VBUSRET.

In both conditions of current flow, the voltage across the capacitor 91 will initially be at (–)VBUS. When node 24B transitions, node 24A will be forced positive. If (–)VBUS is less than +VBUS, current will flow when switching element 42 closes to force the voltage across capacitor 91 to be equal to +VBUS. If (–)VBUS is greater than +VBUS, a current will flow through diode 42A to force the voltage across capacitor 91 to be equal to (–)VBUS.

Figure 11:
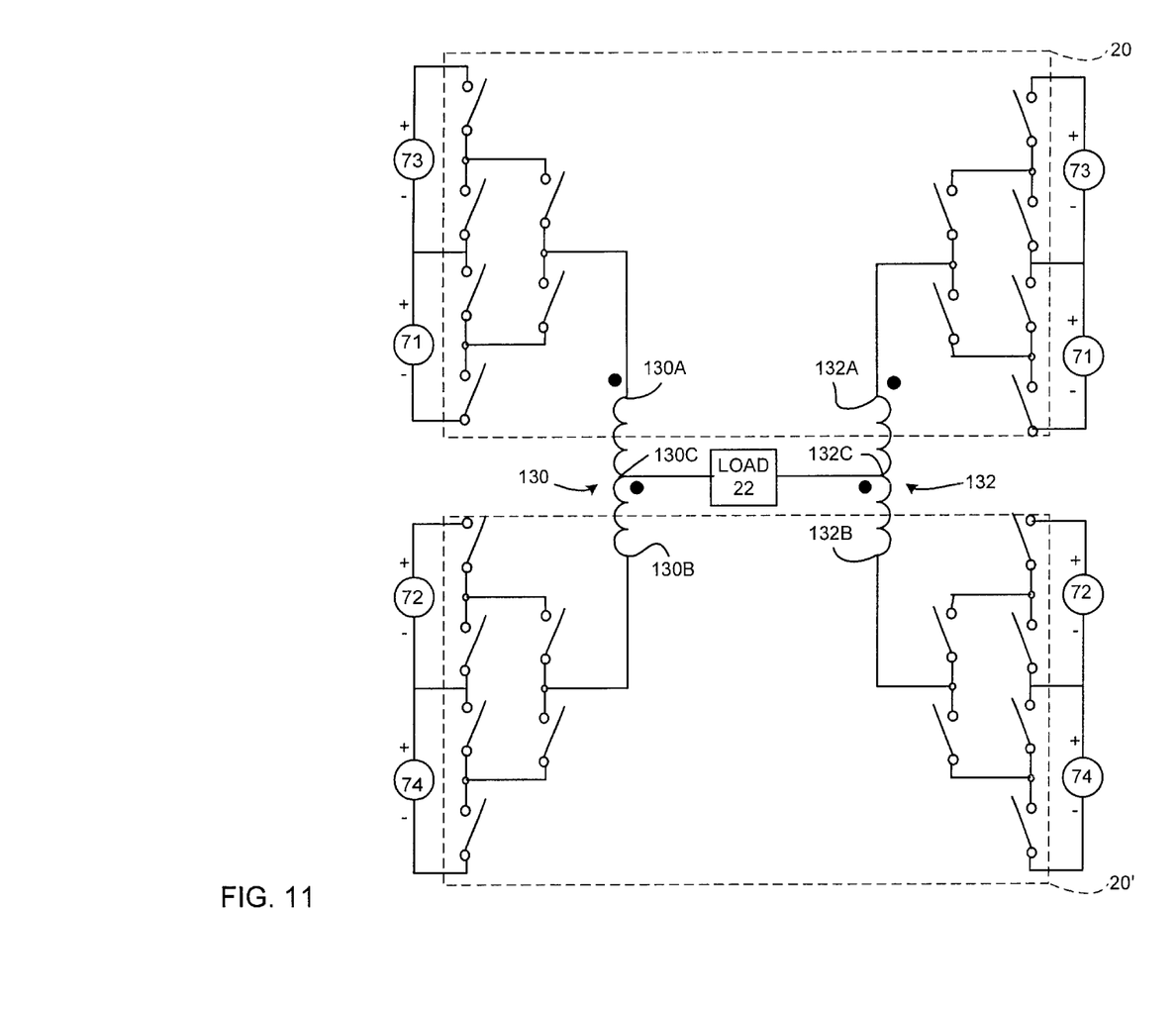
FIG. 11 illustrates connection of two circuit assemblies in parallel.

FIG. 5 and the description above illustrate "nesting" of the bridge assemblies in order to apply voltages across the load approximately equal to a maximum series connection of the plurality of voltage sources used, while a maximum voltage across any one switching device does not exceed a maximum voltage of one of the plurality of power sources. FIG. 11 illustrates connection of multiple circuit assemblies 20 and 20' in order to increase current provided to the load 22 and/or increase the frequency of the voltage applied to the load and thereby minimize filtering requirements. Additional benefits can include reduced peak voltage across the load and reduced ripple current. The use of magnetic coupling elements is described in U.S. Pat. No. 5,070,292 and 5,081,409, which are incorporated herein by reference in their entirety.

As illustrated in FIG. 11, each of the circuit assemblies 20 and 20' is connected to a pair of power sources 71, 73 and 72, 74. Inductive coupling elements 130 and 132 connect the load 22 to the circuit assemblies 20 and 20'. In particular, inductive coupling element 130 has a first end 130A connected to one-half of the circuit 20. A second end 130B is connected to one-half of the circuit 20'. A midpoint 130C is connected to the load 22. Inductive coupling element 132 includes terminals 132A, 132B and 132C that are similarly connected to circuit 20, 20' and load 22. It should be noted that four simple inductors connected between the load and each half of the circuit assemblies 20 and 20' is equivalent to the inductive coupling elements 130 and 132, and therefore, can also be used.

In effect, the circuit assemblies 20 and 20' are in parallel to increase current to the load 22. The sequencing of the second bridge 26 of each circuit 20 and 20' does not change. However, the first bridges 24 of each of the circuits 20 and 20' may be in different states when a transition of the second bridge circuit 22 is desired. When a transition of the second bridge is required, all high frequency first bridge switches should be held in their present state during transition of the second bridge switches (e.g. about 4 microseconds). Pulse-width-modulation activity can then be resumed. Transitioning of the second bridge switches at substantially the same time keeps the size of the coupling magnetics (inductive coupling elements 130 and 132, or other coupling inductors) as small as possible.

It is important to note that in the embodiment of FIG. 11, the same current control loop 100 can be used to provide command signals to each of the circuit assemblies 20 and 20'.

Figure 12:
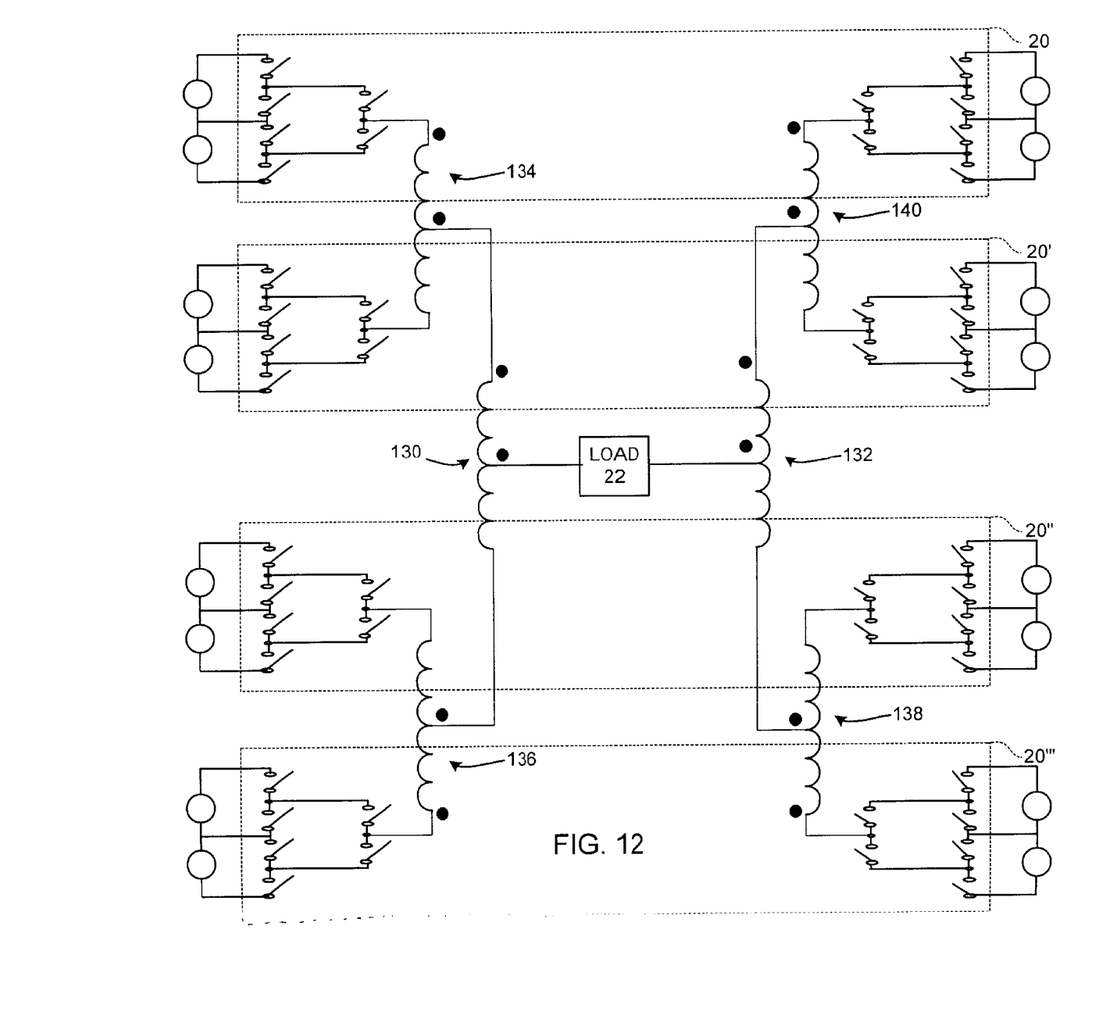
FIG. 12 illustrates connection of four circuit assemblies in parallel.

FIG. 12 illustrates four circuit assemblies 20, 20', 20" and 20''' connected in parallel with inductive coupling elements 130, 132, 134, 136, 138 and 140. Operation is similar to that described above with respect to the embodiment of FIG. 11.

Although the present invention has been described with reference to preferred embodiments, workers skilled in the art will recognize that changes may be made in form and detail without departing from the spirit and scope of the invention.

What is claimed is:

1. A circuit for providing a current through a load, the circuit comprising:

a first bridge circuit connectable to a load, the bridge circuit selectively applying a voltage across the load;

a second bridge circuit connected to the first bridge circuit and connectable to a power supply, the second bridge circuit selectively applying voltage to terminals of the first bridge circuit.

2. The circuit of claim 1 wherein the first bridge circuit operates at a frequency higher than a frequency of the second bridge circuit.

3. The circuit of claim 1 wherein the power supply comprises two power source, and wherein the second bridge circuit includes three terminals connectable to the power sources, the three terminals including a first terminal connected to a positive terminal of a first power source, a second terminal connected to a negative terminal of a second power source, and a third terminal connected to a negative terminal of the first power source and connected to a positive terminal of the second power source.

4. The circuit of claim 1 wherein the second bridge circuit selectively provides a first voltage level and a second voltage level to the first bridge circuit.

5. The circuit of claim 1 wherein the load is connectable across two terminals of the first bridge circuit, and wherein each terminal is connected to a common node of two series connected switching devices of the first bridge circuit, and wherein a capacitor is connected in parallel across each of said two series connected switching devices.

6. The circuit of claim 2 and further comprising a diode Connected in parallel across associated terminals of the switching devices.

7. The circuit of claim 1 and further comprising a controller operably coupled to each of the bridge circuits, the controller controlling the first bridge circuit pursuant to a pulse-width modulation technique, the controller further controlling the second bridge circuit to provide at least two different voltage potentials to the first bridge circuit.

8. A circuit for providing a current through a load, the circuit comprising:

a nested bridge circuit connectable to a load and a plurality of power sources, the nested bridge circuit comprising a plurality of switching devices, the switching devices being connected together so as to selectively apply a voltage across the load approximately equal to a maximum series connection of the plurality of voltage sources, while a maximum voltage across any one switching device does not exceed a maximum voltage of one of the plurality of power sources.

9. The circuit of claim 8 wherein the load is connectable across two terminals of the nested bridge circuit, and wherein each terminal is connected to a common node of two series connected switching devices, and wherein a capacitor is connected in parallel across each of said two series connected switching devices.

10. The circuit of claim 9 and further comprising a diode connected in parallel across associated terminals of at least some of the switching devices.

11. The circuit of claim 8 and further comprising a controller operably coupled to each of the switching devices, the controller operating a first plurality of switching devices closest to the load pursuant to a pulse-width modulation technique, the controller further operating a second plurality of switching devices to provide at least two different voltage potentials to the first plurality of switching devices.

12. A method of operating a pulse width modulating circuit, the pulse width modulating circuit comprising a first bridge circuit connected to a load and a second bridge circuit connected to the first bridge circuit and connected to a power supply, the method comprising:

selectively applying at least two different voltage potentials to terminals of the first bridge through the second bridge; and operating the first bridge to apply an average voltage to the load.

13. The method of claim 12 wherein operating includes controlling the first bridge using a pulse-width modulation technique.

14. The method of claim 13 wherein the step of operating is performed at a higher frequency than the step of selectively applying at least two different voltage potentials.

15. The method of claim 13 and further comprising at least one of measuring or estimating a voltage across the load, and wherein the step of applying is performed as a function of the measured or estimated voltage across the load.

* * * * *